(12) United States Patent
Fefer et al.

(10) Patent No.: US 7,741,826 B1
(45) Date of Patent: Jun. 22, 2010

(54) DEVICE AND METHOD FOR COMPENSATING FOR GROUND VOLTAGE ELEVATIONS

(75) Inventors: Yefim Fefer, Petach Tikva (IL); Michael Zimin, Austin, TX (US); Sergey Sofer, Rishon LeZion (IL)

(73) Assignee: Freescale Semiconductor, Inc., Austin, TX (US)

( * ) Notice: Subject to any disclaimer, the term of this patent is extended or adjusted under 35 U.S.C. 154(b) by 283 days.

(21) Appl. No.: 11/837,587

(22) Filed: Aug. 13, 2007

(51) Int. Cl.
*G05F 1/565* (2006.01)
(52) U.S. Cl. ...................................... 323/284; 361/152
(58) Field of Classification Search ......... 323/282–288; 363/95, 21.15, 56.03; 327/108, 58, 310, 327/390, 536; 365/203, 226, 189.05
See application file for complete search history.

(56) References Cited

U.S. PATENT DOCUMENTS 5,513,218 A * 4/1996 Moller ........................ 375/257
6,538,497 B2 3/2003 Thomas et al.
7,262,589 B2 * 8/2007 Chen ........................... 323/282

OTHER PUBLICATIONS

Toshiro Tsukada et al., "An On-Chip Active Decoupling Circuit to Suppress Crosstalk in Deep-Submicron CMOS Mixed-Signal SoCs," IEEE Journal of Solid-State Circuits, vol. 40, No. 1, Jan. 2005, pp. 67-79.

* cited by examiner

*Primary Examiner*—Rajnikant B Patel

(57) ABSTRACT

A method and a device, the device has ground voltage elevation compensation capabilities and includes: multiple current consuming components; a positive voltage supply input; a negative voltage supply input; and a compensation circuit, coupled to the negative voltage supply input and to a grounding element; wherein the compensation circuit is adapted to detect a ground voltage elevation resulting from a flow of excess consumption current through the grounding element, and in response couple the negative voltage supply input to the grounding element; wherein the excess current flows through the grounding element due to an increment in a current consumption of a current consuming element of the device.

20 Claims, 4 Drawing Sheets

DEVICE AND METHOD FOR COMPENSATING FOR GROUND VOLTAGE ELEVATIONS

FIELD OF THE INVENTION

The present invention relates to devices and methods for compensating for ground voltage elevations within an integrated circuit.

BACKGROUND OF THE INVENTION

Modern integrated circuits are required to operate at very high frequencies while consuming a relatively low supply voltage which has dramatically decreased during the last decade.

This supply voltage reduction has some drawbacks such as an increased sensitivity to ground voltage elevations that are proportional to a current (I) consumed by components of the integrated circuit and to the resistance (R) of grounding elements through which the current flows.

A ground voltage elevation can reduce the voltage that is provided to internal components of the integrated circuit, increase the noise level within the integrated circuit and thus can temporarily prevent the integrated circuit from operating in a proper manner.

There is a need to provide a device and method for efficiently compensating for ground voltage elevations.

SUMMARY OF THE PRESENT INVENTION

A device and a method for compensating for ground voltage elevations, as described in the accompanying claims.

BRIEF DESCRIPTION OF THE DRAWINGS

The present invention will be understood and appreciated more fully from the following detailed description taken in conjunction with the drawings in which.

DETAILED DESCRIPTION OF PREFERRED EMBODIMENTS

The following figures illustrate exemplary embodiments of the invention. They are not intended to limit the scope of the invention but rather assist in understanding some of the embodiments of the invention. It is further noted that all the figures are out of scale.

According to various embodiments of the invention a method and device for compensating for ground voltage elevations are provided. The compensation can involve comparing the voltage at a sensing point to a voltage at a reference point and providing a source path to a negative voltage supply unit when a ground voltage elevation (especially of above a certain value) is detected. Conveniently, the compensation process is relatively fast, in comparison to the development of the ground voltage elevation.

Figure 1:
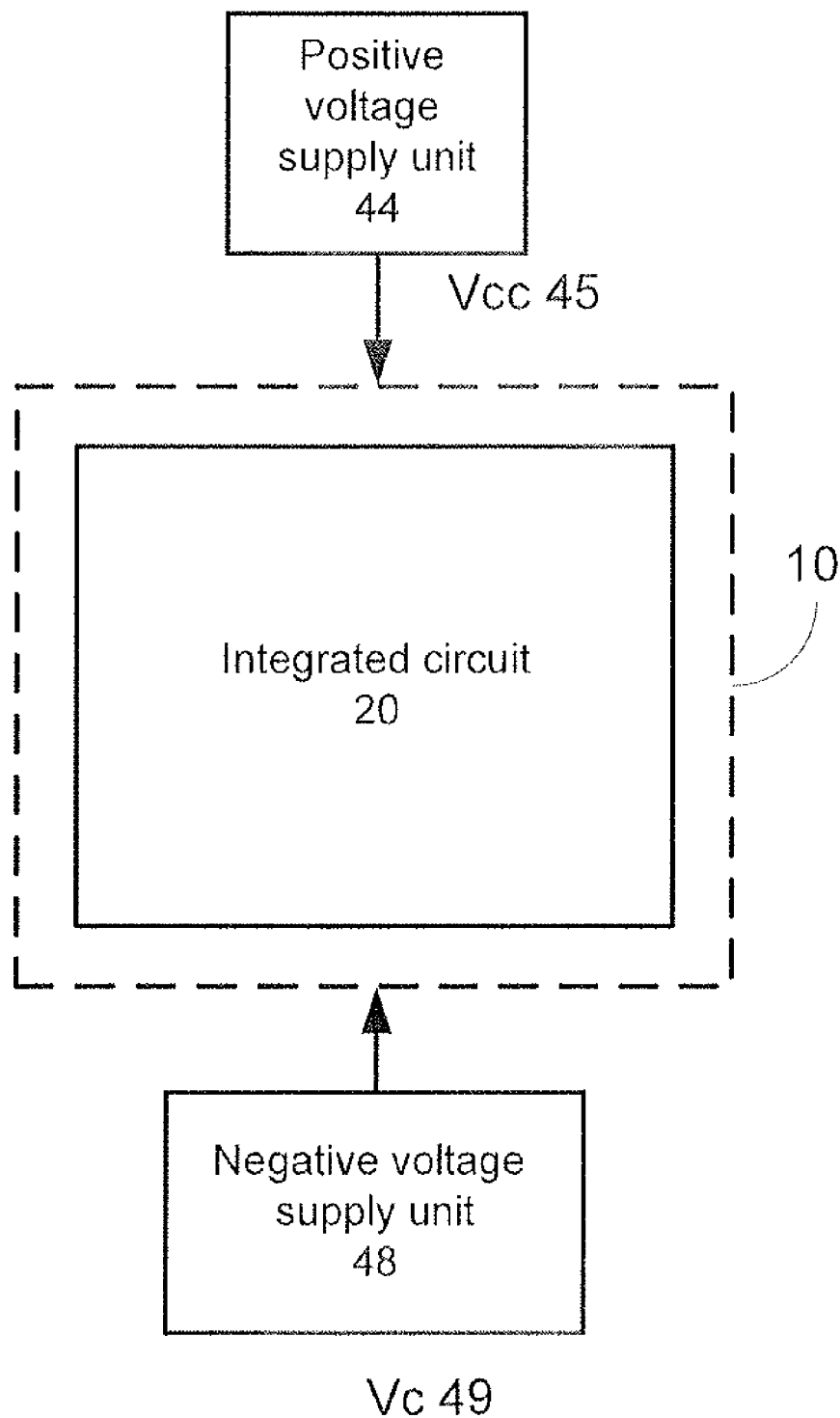
FIG. 1 illustrates a device and voltage supply units according to an embodiment of the invention.

FIG. 1 illustrates device 10, and voltage supply units 44 and 48 according to an embodiment of the invention.

Device 10 can include one or more integrated circuits, can be connected to multiple voltage supply units, and can be a mobile device such as but not limited to a cellular phone, a laptop computer, a personal data accessory and the like.

For convenience of explanation only FIG. 1 illustrates device 10 as including integrated circuit 20 that is connected to positive voltage supply unit 44 and negative voltage supply unit 48. It is noted that device 10 can include one or more of these voltage supply units, but this is not necessarily so.

According to an embodiment of the invention negative voltage supplied by negative voltage supply unit 48 is used by integrated circuit 20 only for ground voltage elevation compensation purposes, but this is not necessarily so. For example, the negative voltage can be used for additional purposes.

Positive voltage supply unit 44 provides a positive supply voltage Vcc 45 while the negative voltage supply unit 48 provides a negative supply voltage Vc 49. Conveniently Vc 49 is supplied to one or more negative voltage supply inputs of integrated circuit 20 and Vcc 45 is supplied to one or more positive voltage supply inputs of integrated circuit 20.

The value of Vcc 45 can substantially equal the absolute value of Vc 49, but this is not necessarily so. For example, Vc 49 can be substantially lower than Vcc 45.

Integrated circuit 20 includes multiple current consuming components (such as cores, cache memory units, DMA controllers) that can rapidly increase their current consumption thus causing ground voltage elevations.

Conveniently, multiple compensation circuits are located near current consuming elements that are connected to the ground grid through grounding elements which are expected to experience ground voltage elevations, and provide local compensation for local ground voltage elevations. The grounding elements can form one or more ground grids, as illustrated in FIG. 2.

The provision of local compensation circuits that are relatively small and can be connected to one or more negative voltage supply inputs via relatively narrow (and hence relatively highly resistive) conductors reduces a die area penalty associated with the ground voltage elevation compensation scheme.

Figure 2:
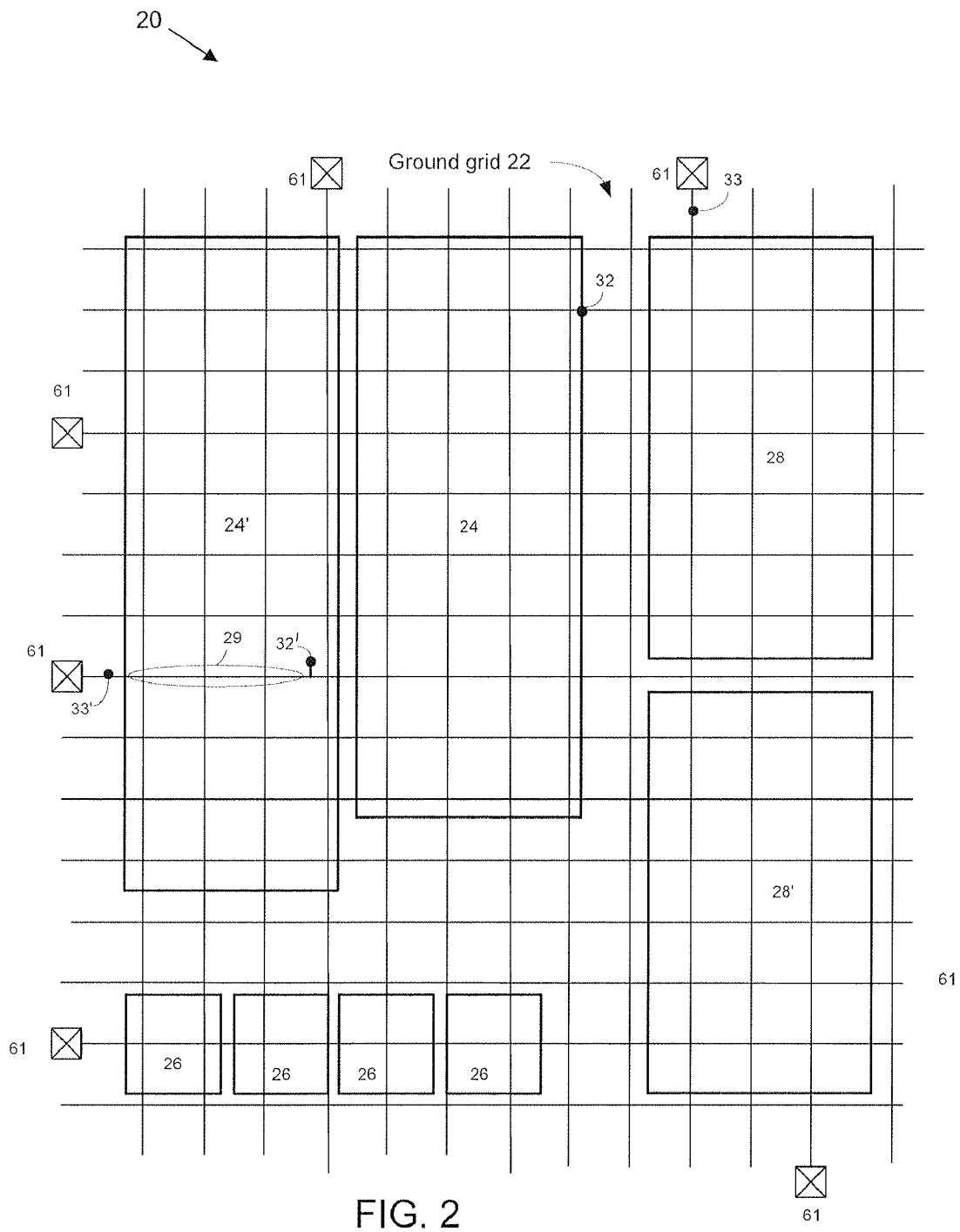
FIG. 2 illustrates various portions of an integrated circuit, according to an embodiment of the invention.

FIG. 2 illustrates various portions of an integrated circuit 20, according to an embodiment of the invention.

Integrated circuit 20 includes multiple grounding elements that can form one or more ground grids. FIG. 2 illustrates a single ground grid 22 that includes multiple grounding elements that are represented by portions of the vertical and horizontal lines that represent a single ground grid. An ellipse surrounds grounding element 29 that connects reference point 33' and sensing point 32'. It is noted that reference point 33' is not necessarily connected to ground through pin 61. Integrated circuit 20 also includes one or more power supply grids that are not shown for convenience of explanation. Ideally, the voltage level across the whole power grid is the same but in reality, due to the resistance of grounding elements that form ground grid 22, the voltage level can differ from one grounding element to another, and thus local compensation circuits can be very effective.

Integrated circuit 20 also includes current consuming components such as cores 24 and 24', peripherals (I/O pads etc.) 26 and memory units 28 and 28'.

Ground grid 22 is connected to one or more pins 61 that also can serve as a ground voltage reference point 33.

Ground grid 22 is connected to core 24, core 24', memory unit 28, memory unit 28', and to peripherals 26.

Two exemplary, non-limiting and out of scale sensing points 32 and 32' are also illustrated. Sensing point 32 is positioned within the area of core 24 while sensing point 32' is located within core 24'. It is noted that much more than a pair of sensing points can be defined within integrated circuit 20. It is further noted that sensing points can be located within other components of the integrated circuit 20 as well as between components of the integrated circuit 20. Each compensation circuit can detect the voltage potential between such a sensing point and a reference point that is expected to be less affected or not affected at all by the ground voltage elevation. The reference points can be located near pins 61, especially between pins 61 and a decoupling capacitor (not shown).

Ground voltage elevations are formed when the current consumption of one or more of these components increases, and especially when the consumed currents are relatively high. Such an increase in current consumption is usually associated with complex computational tasks, memory transfer bursts and the like.

The multiple sensing points are selected such as to detect these ground voltage elevations. The selection is usually based upon a simulation of the integrated circuit. Designers are usually well aware of the possible current consuming components. Typically, more than one local compensation circuit is positioned such as to take care of a single core. In addition, the local compensation circuits can be placed at any distance from pins 61.

Figure 3:
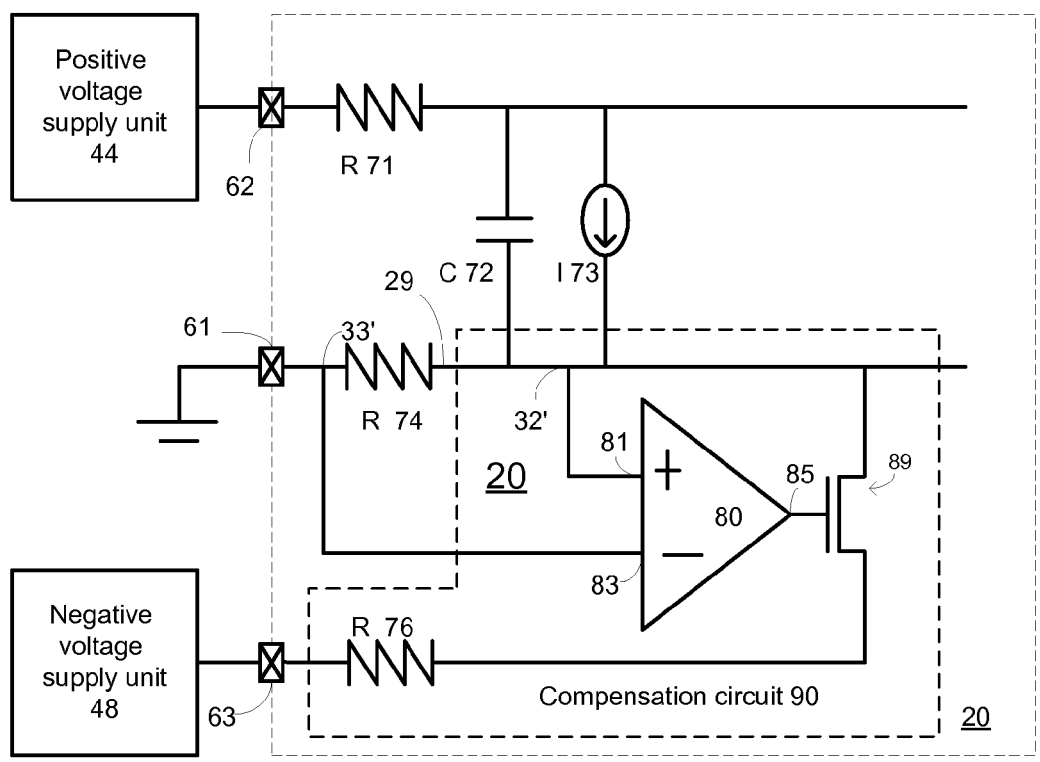
FIG. 3 is a schematic electric diagram of a compensation circuit as well as various equivalent components according to an embodiment of the invention.

FIG. 3 is a schematic electric diagram of a compensation circuit 90 as well as various grid components 71, 72, 73, 74, 76, according to an embodiment of the invention.

Grid components include equivalent resistors 71, 74 and 76, equivalent capacitor 72 and current sink 73 that represent the resistances, capacitance and current consumption of various components of integrated circuit 20.

Resistor 71 represents the (parasitic) resistance of a positive voltage supply element 44 that connects positive voltage supply input 62 to a certain internal point of integrated circuit 20. Resistor 74 represents the resistance of grounding element 29 that is located between pin 61 (and reference point 33') and sensing point 32'. Resistor 76 represents the resistance of a relatively highly resistive conductor that connects negative voltage supply input 63 to switch 89 of compensation circuit 90. Capacitor 72 represents the equivalent capacitance of the integrated circuit as viewed between pin 61 and positive voltage supply input 62. Current sink 73 represents the current consumption of one or more components of integrated circuit 20, as viewed between pin 61 and positive voltage supply input 62.

Capacitor 72 can represent a decoupling capacitor that is drained by excessive current that flows through grounding element 29 once the current consumption experiences a transient.

Compensation circuit 90 includes comparator 80, switch 89 and a conductor that connects switch 89 to negative voltage supply input 63. A non-inverting input 81 of comparator 80 is connected to sensing point 32' (sensing point 32' is graphically illustrated as being connected to the grounding element 29 adjacent to one end of capacitor 72 and one end of current sink 73). The other ends of capacitor 72 and current sink 73 are connected to the certain internal point of integrated circuit 20. That certain internal point is connected to resistor 71.

An inverting input 83 of comparator 80 is connected to ground voltage reference point (also referred to as reference point) 33' that represents ground potential, which is not affected by the voltage elevation. Comparator 80 is connected in parallel to grounding element 29 thus is capable of detecting ground voltage elevation. It is noted that the detection can involve detecting a ground voltage elevation that exceeds a predefined value. A certain amount of current can flow through the grounding element 29 while causing ground voltage elevation, lower than the predefined level once a ground voltage elevation is detected, comparator 80 outputs a control signal via output 85 and opens switch 89 which is a MOSFET transistor. When switch 89 is opened, it connects the grounding element 29 to the negative voltage supply unit 48 (via negative voltage supply input 63) and allows input 63 to drain the excessive current. When switch 89 is opened it stops the discharge of capacitor 72 by providing the excess current drain path.

Conveniently, compensation circuit 90 is characterized by a response time that is relatively short in comparison to a development time of a substantially ground voltage elevation.

Figure 4:
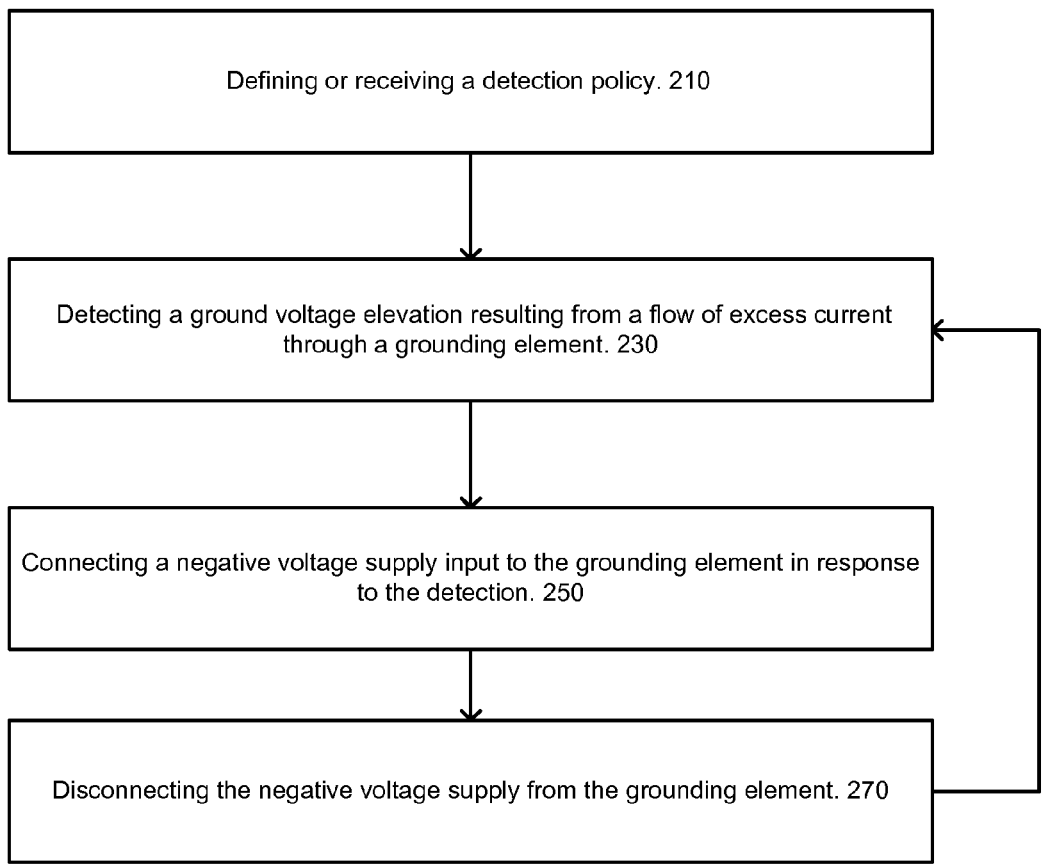
FIG. 4 is a flow chart of a method for compensating for a ground voltage elevation according to an embodiment of the invention.

FIG. 4 is a flow chart of method 200 for compensating for a ground voltage elevation according to an embodiment of the invention.

Method 200 starts by optional stage 210 of defining or receiving a detection policy. The detection policy can mandate that the detection is performed in a continuous manner, according to a predefined detection pattern, in response to a reception of an alert that can represent expected current raise, and the like.

Each detection session can occur within a predefined measurement period, as well as within a dynamically changing measurement period. It is noted that the detecting can involve sampling the voltage developed over the grounding element.

Stage 210 is followed by stage 230 of detecting a ground voltage elevation resulting from a flow of excess current through a grounding element. Conveniently, the excess current flows through the grounding element due to an increment in a current consumption of a current consuming element of the device. Conveniently, the excess current is discharged through a decoupling capacitor.

Stage 230 is followed by stage 250 of connecting a negative voltage supply input to the grounding element in response to the detection.

Conveniently, stage 250 enables sinking of at least a portion of the excess current.

Conveniently, stage 250 includes connecting the negative voltage supply input via a relatively highly resistive conductor. The level of the negative supply voltage provided to the negative voltage supply input and a resistance of the relatively highly resistive conductor are designed to be matched such as to provide successful compensation and optimal overall circuit performance.

Conveniently, stage 250 of coupling includes closing a switch. Conveniently, the switch can be pulse width modulated. Conveniently, the switch is a transistor.

Conveniently, stage 250 at least partially reduces a discharge of a decoupling capacitor by the excess current.

Conveniently, various stages of method 200 can be executed concurrently by multiple compensation circuits that are mutually independent.

Stage 250 is followed by stage 270 of disconnecting the negative voltage supply from the grounding element. Stage 270 can be followed by stage 230. Stage 250 can be followed by stage 270 once the compensation is completed. The compensation can be completed once a completion criterion is fulfilled. The completion criterion can relate to a reduction in the ground voltage elevation to an acceptable level.

Variations, modifications, and other implementations of what is described herein will occur to those of ordinary skill in the art without departing from the spirit and the scope of the invention as claimed. Accordingly, the invention is to be defined not by the preceding illustrative description but instead by the spirit and scope of the following claims.

We claim:

1. A device having ground voltage elevation compensation capabilities, the device comprises:
   multiple current consuming components;
   a positive voltage supply input;
   a negative voltage supply input; and
   a compensation circuit coupled to the negative voltage supply input, to a grounding element and to a ground voltage reference point;
   wherein the compensation circuit, during device operation, functions to detect a ground voltage elevation resulting from a flow of excess current through the grounding element, and in response couple the negative voltage supply input to the grounding element;
   wherein the excess current flows through the grounding element due to an increment in a current consumption of a current consuming element of the device.

2. The device according to claim 1 wherein the compensation circuit comprises a comparator which, during device operation, functions to detect a ground voltage elevation that exceeds a predefined threshold, in comparison to the ground potential reference, and in response to drain at least a portion of the excess current.

3. The device according to claim 1 wherein the compensation circuit is coupled to the negative supply voltage input via a resistive conductor; and wherein a level of a negative supply voltage provided to the negative supply voltage input is designed such as to compensate for the voltage drop over the resistive conductor.

4. The device according to claim 1 wherein the compensation circuit, during device operation, functions to detect the ground voltage elevation according to a predefined detection pattern.

5. The device according to claim 1 wherein the compensation circuit comprises a switch which, during device operation, functions to enter a conductive mode in response to a detection of a ground voltage elevation.

6. The device according to claim 5 wherein the switch is pulse width modulated.

7. The device according to claim 5 wherein the switch is a transistor.

8. The device according to claim 5 wherein the switch is linearly regulated.

9. The device according to claim 1 wherein the excess current discharges a decoupling capacitor and wherein the compensation circuit selectively compensates for the discharge.

10. A method for compensating for a ground voltage elevation, the method comprises:
    detecting a ground voltage elevation resulting from a flow of excess current through a grounding element; and
    coupling a negative voltage supply input to the grounding element in response to the detection;
    wherein the excess current flows through the grounding element due to an increment in a current consumption of a current consuming element of the device.

11. The method according to claim 10 wherein the coupling enables at least a portion of the excess current to be drained.

12. The method according to claim 10 wherein the coupling comprises coupling the negative voltage supply input via a resistive conductor; and wherein a level of a negative supply voltage provided to the negative voltage supply input is designed such as to compensate for a voltage drop over the resistive conductor.

13. The method according to claim 10 wherein the detecting comprises performing detection sessions according to a predefined detection pattern.

14. The method according to claim 10 wherein the coupling comprises causing a switch to enter a conductive mode.

15. The method according to claim 14 wherein the coupling comprises pulse width modulating the switch.

16. The method according to claim 14 wherein the switch is a transistor.

17. The method according to claim 14 wherein the switch is linearly regulated.

18. The method according to claim 10 wherein the coupling at least partially reduces a discharge of a decoupling capacitor by the excess current.

19. The method according to claim 10 further comprising executing the stage of detecting and coupling by multiple compensation circuits that are mutually independent.

20. The device of claim 1, wherein the compensation circuit includes a first input, a second input, and an output, wherein the output is coupled to the negative voltage supply input, the first input is coupled to a sensing point associated with the grounding element, and the second input is coupled to the ground voltage reference point, and
    wherein the compensation circuit, during device operation, functions to detect the ground voltage elevation based on voltages at the sensing point and the ground voltage reference point.

* * * * *